United States Patent [19]

Oberhammer et al.

[11] Patent Number: 6,115,363
[45] Date of Patent: *Sep. 5, 2000

[54] TRANSCEIVER BANDWIDTH EXTENSION USING DOUBLE MIXING

[75] Inventors: Wolfgang Oberhammer, Ottawa; Andy Rowland, Kanata, both of Canada

[73] Assignee: Nortel Networks Corporation, Montreal, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/802,692

[22] Filed: Feb. 19, 1997

[51] Int. Cl.[7] .............................. H04B 7/00; H04B 1/26
[52] U.S. Cl. ............................. 370/277; 455/314
[58] Field of Search ....................... 455/236.1, 130, 455/113, 132, 136, 137, 139, 289, 296, 303, 307, 313, 314, 315, 330, 334, 338, 340; 370/277, 280, 294, 310, 314, 321, 337

[56] References Cited

U.S. PATENT DOCUMENTS 4,879,758  11/1989  Deluca et al. ........................ 455/296
5,108,334  4/1992  Eschenbach et al. ................. 455/314
5,248,943  9/1993  Fox et al. ............................. 324/322
5,606,736  2/1997  Hasler et al. ........................ 455/314
5,613,234  3/1997  Vella-Coleiro ...................... 455/340
5,678,169  10/1997  Turney ................................... 455/1

FOREIGN PATENT DOCUMENTS

0713298  11/1995  European Pat. Off. .
1324679  7/1973  United Kingdom .
2233520  8/1989  United Kingdom .

Primary Examiner—Chau Nguyen
Assistant Examiner—Chiho Andrew Lee

[57] ABSTRACT

A radio transceiver system uses a single variable local oscillator frequency source which is used in mixing both before and after a band-pass filter. This causes a reduction in band-pass filter bandwidths. In an all-band transceiver for PCS for example the effect of this reduced bandwidth requirement is to increase the spacing between the transmit bands and the receive bands and thereby enable a reduction in transmission noise interfering with the reception bands.

18 Claims, 5 Drawing Sheets

TRANSCEIVER BANDWIDTH EXTENSION USING DOUBLE MIXING

FIELD OF THE INVENTION

The invention relates to apparatus for radio frequency communication and particularly to radio transceivers.

BACKGROUND OF THE INVENTION

The heterodyne concept is employed extensively in radio receivers and transmitters. The principle is based on shifting a receive signal to a much lower fixed intermediate frequency (IF). During this process the information modulated on the carrier remains unaltered and occupies an equal bandwidth centered on the intermediate frequency. The lower frequency domain allows simpler signal processing. The required frequency translation to the intermediate frequency is accomplished by mixing the incoming signal with a locally generated signal which differs from the incoming carrier by the intermediate frequency. In the typical heterodyne receiver, one oscillator-mixer pair is used to shift the receive or transmit frequency. However, a receive signal may be shifted two or more times to realize various analog processing advantages such as filtering, image rejection and demodulation. The same applies to a transmitter operating in the reverse direction.

In a time division multiple access system, such as a personal communication system, many modulated carriers are spaced several channels apart. Typically, a fixed IF oscillator and a stepped RF local oscillator (LO) are employed to allow channel selection. The LO is set to one IF frequency below or above the desired RF channel and tracks this channel.

In the specific case of the North American PCS frequency allocation, FCC standard Part 24 (24.229) specifies that the frequency range 1850.01–1909.95 MHz is available for base-station reception/mobile transmission and 1930.05–1989.99 MHz is available for base-station transmission/mobile reception, yielding a maximum bandwidth of 59.94 MHz each for reception and transmission. Within each of these ranges there are individual bands, A through to F; these bands are further divided into individual channels of 30 KHz bandwidth. According to the frequency allocation a mobile transceiver operating in Band A, for example, receives its signal in the appropriate channel of receive Band A, a frequency 80.04 MHz higher than the signal it transmits; likewise for bands B through to F.

A microcell is a basestation for an indoor wireless communication system. Microcells operate according to the frequency allocation standard referred to above and are capable of simultaneous transmission and reception of signals. Usually a microcell is provided with an external duplex filter which determines the band that the microcell operates in. However, there could be a need for a microcell which is capable of operating over all of the bands A to F. Such a device would enable a single product to be manufactured for use in different bands rather than require different devices for the different bands, resulting possibly in economies of scale particularly with greater and greater integration of components within the device.

A problem in designing a single basestation like a microcell in this way is that there is only a narrow (20.10 MHz) isolation band between the uppermost microcell receive frequency, 1909.95 MHz, and the lowermost microcell transmit frequency, 1930.05 MHz as opposed to about 65 MHz for a device designed to operate only on a single band. Consequently, achieving adequate filtering for an all-band microcell is problematic since it is difficult to design a low cost microcell comprising band-pass receive and transmit filters meeting the required specification, namely; a centre frequency around 1900 MHz, a bandwidth of 59.94 MHz and a desirable 100 dB rejection beyond 20 MHz of the filter band-edges.

SUMMARY OF THE INVENTION

It is a general object to provide a novel mixing technique for use in a heterodyne radio transmitter, receiver or transceiver.

It is a further object of this invention to provide a transceiver which is capable of simultaneous transmission and reception and in which the isolation band between an assigned set of transmit frequencies and an assigned set of receive frequencies may be effectively increased thereby reducing the danger of interference.

More specifically, it is an object of this invention to provide such a single transceiver device that can be used for all bands of a microcell basestation relating to FCC standard Part 24.229.

This invention introduces a novel mixing technique employing a single variable RP local oscillator (LO) which supplies the same mixing frequency to a mixer before a band-pass filter and to a mixer after the band-pass filter. The identified technique offers a reduction in the band-pass filter bandwidth by at least 50% in comparison to a transceiver constructed using the prior art. This approach does not limit one to the stricter filter design specifications imposed by having only 20.10 MHz available between the uppermost receive frequency and the lowermost transmit frequency. As a consequence it is simpler to reject transmission noise in the reception band. Other advantages include: a reduction in the number of circuit components required since a single LO can be used for at least 4 mixers (2 transmit, 2 receive) and a lowering of the phase noise in the system since the LO tuning range is reduced by at least 50%. Due to the way the local oscillator is applied in the invention an interstage filter with tracking characteristics is generated resulting in improved image and spurious attenuation.

According to a first broad aspect, the invention provides a mixing stage for a heterodyne radio transmitter comprising: an input for a transmit IF signal; first and second mixers; a variable frequency local oscillator; and a passband filter having first and second sides; the first mixer having a first input connected to the input for the IF transmit signal, a second input connected to be driven by the variable frequency local oscillator and an output connected to the first side of the passband filter; the second mixer having a first input connected to the second side of the passband filter, a second input connected to be driven by the variable frequency local oscillator and an output serving as an output of the mixing stage.

According to a second broad aspect, the invention provides a mixing stage for a heterodyne radio receiver comprising: an input for a received signal; first and second mixers; a variable frequency local oscillator; and a passband filter having first and second sides; the first mixer having a first input connected to the input for the received signal, a second input connected to be driven by the variable frequency local oscillator and an output connected to the first side of the passband filter; the second mixer having a first input connected to the second side of the passband filter, a second input connected to be driven by the variable frequency local oscillator and an output at which is derived a receive IF signal and which serves as an output of the mixing stage.

According to a third broad aspect, the invention provides a heterodyne radio transceiver comprising a transmit section having a transmit mixing stage and a receive section having a receive mixing stage, the transmit mixing stage comprising: an input for a transmit IF signal; first and second mixers; a variable frequency local oscillator; and a passband filter having first and second sides; the first mixer having a first input connected to the input for the IF transmit signal, a second input connected to be driven by the variable frequency local oscillator and an output connected to the first side of the passband filter; the second mixer having a first input connected to the second side of the passband filter, a second input connected to be driven by the variable frequency local oscillator and an output serving as an output of the transmit mixing stage; the receive mixing stage comprising: an input for a received signal; first and second mixers; a variable frequency local oscillator; and a passband filter having first and second sides; the first mixer having a first input connected to the input for the received signal, a second input connected to be driven by the variable frequency local oscillator and an output connected to the first side of the passband filter; the second mixer having a first input connected to the second side of the passband filter, a second input connected to be driven by the variable frequency local oscillator and an output at which is derived a receive IF signal and which serves as an output of the receive mixing stage.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 1:
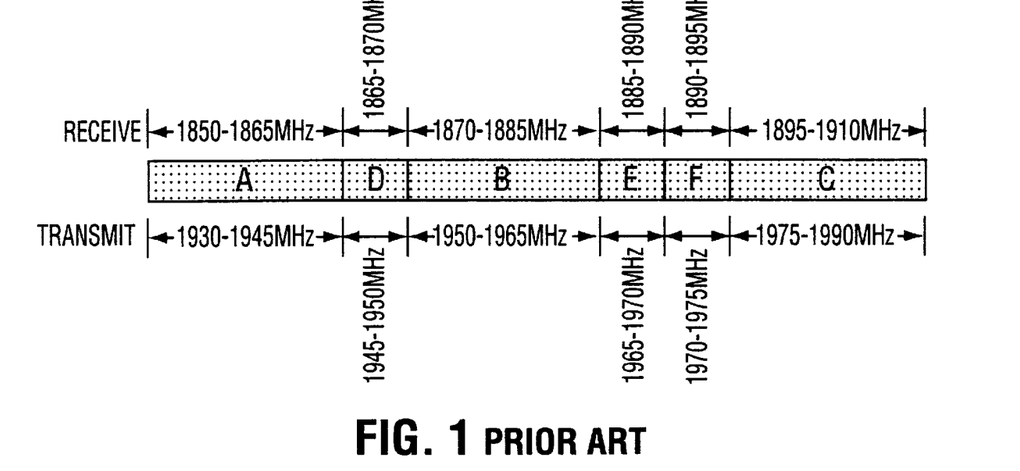
FIG. 1 is a schematic illustration of the PCS bands for base-station transmit and receive according to FCC standard Part 24.229.

FIG. 1 illustrates the spectral range for basestation reception and transmission in the cellular band for mobile PCS prescribed by FCC standard Part 24.229. A microcell is configured A, B, C, D, E or F band for both reception and transmission. For a bi-directional communication link the microcell is assigned to operate in one of these bands. Thus, in a particular band the frequencies for microcell transmission are those for mobile reception and vice-versa. As such a single band microcell transceiver, assigned to Band A, will receive over channels in the range 1850.01–1865 MHz, and will transmit in a range 80.04 MHz higher, in reception Band A 1930.05–1945 MHz; likewise for bands B through to F. Individual channels within the bands have uniform bandwidths of 30 KHz. Since the microcell transceiver operates in only one band it is simple to ensure there is no direct interference from other bands in the PCS system. However, if one were to construct a multi-band transceiver unit it is necessary to appreciate that there may be deleterious effects arising from cross-band interference. To ensure interference-free multi-band operation suitable filter means must be implemented to ensure that the highest frequency receive signal does not interfere with the lowest frequency transmit signal. For an all-band PCS transceiver these frequencies correspond to 1909.95 MHz (band C) and 1930.05 MHz (band A), respectively. In practice, due to ambient effects and systematic errors in the apparatus even more stringent filter characteristics may be required since this isolation bandwidth may be further reduced from 20.10 MHz to around 10 MHz. For a single microcell transceiver designed to operate over all the PCS bands it is desirable for the transmitted signal to be filtered to a level typically as high as 100 dB in the reception band.

Figure 2A:
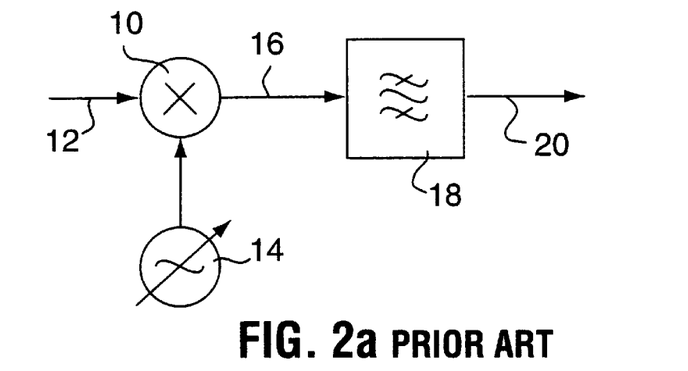
FIG. 2a is a schematic illustration of a conventional mixing stage for a heterodyne transmit unit.
Figure 2B:
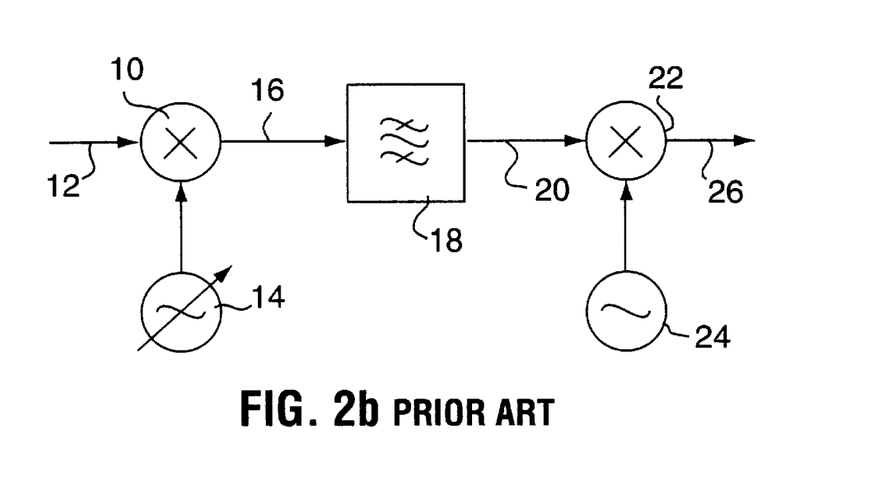
FIG. 2b is a schematic illustration of a second conventional mixing stage for a heterodyne transmit unit.

FIG. 2a shows the essential elements of a conventional mixing stage for a heterodyne transmit unit comprising a mixer 10 to which is connected a Transmit IF input 12 and an output from local oscillator 14 generating radio-frequency signals. The output 16 of the mixer inputs to a band-pass filter 18 and is output at 20. It will be understood to persons skilled in the art that the mixer 10 produces an output signal having a component with a frequency of the IF signal and the selected local oscillator frequency and a component with a frequency equal to the difference of the frequency of the IF signal and the selected local oscillator frequency. The filter 18 selects the sum component and rejects the difference component. An alternative of this conventional approach is shown in FIG. 2b and comprises the elements of FIG. 2a with output 20 coupled as one input to an additional mixer 22 having a second input from a fixed frequency local oscillator 24. The resulting mixed signal is the upconverted output of the transmitter 26. As with the FIG. 2a embodiment, the filter 18 selects the sum component of the mixer output and rejects the difference component. This selected first upconverted signal is then mixed with the signal from the local oscillator 24 to provide a second upconverted signal having a frequency equal to the sum of the frequency of the first upconverted signal and the selected frequency from the local oscillator 24. As would be known to persons skilled in the art, there would also be a component output at 26 which has a frequency equal to the difference of the two inputs of mixer 22, which difference component is conventionally filtered out at some later stage.

Throughout we will assign an arbitrary frequency of 85.01 MHz for the Transmit IF to enable a comparative analysis to be made of the conventional approach to transceiver design and that according to the invention. In order to permit all-band PCS transmission in the system of FIG. 2a with the assigned Transmit IF the system would require a band-pass filter 18 with centre frequency 1879.98 MHz and a bandwidth of 59.94 MHz. Local oscillator 14 would need to be stepped by one channel, i.e. 30 KHz, through the range 1765–1824.94 MHz.

With the alternative conventional heterodyne transmitter approach of FIG. 2b, to construct an all-band transmit unit an 85.01 MHz Transmit IF requires band-pass filter 18 to be centered at a lower frequency, i.e. 912.47 MHz, while retaining a 59.94 MHz bandwidth. Local oscillator 14 would need to be stepped by one channel bandwidth, i.e. 30 KHz, through the lower frequency range 882.50–942.44 MHz while local oscillator 24 operates at a fixed frequency of 882.50 MHz, the lowest frequency of variable local oscillator 14.

It is important to note that while the bandwidth of the transmission band and the transmit filter 18 are preferably equal they do not coincide in the frequency domain. In the transmitter system of FIG. 2a this filter is displaced by one IF frequency, while in the system of FIG. 2b this difference is established by the sum of one IF frequency and the frequency of the fixed frequency local oscillator 24.

Figure 2C:
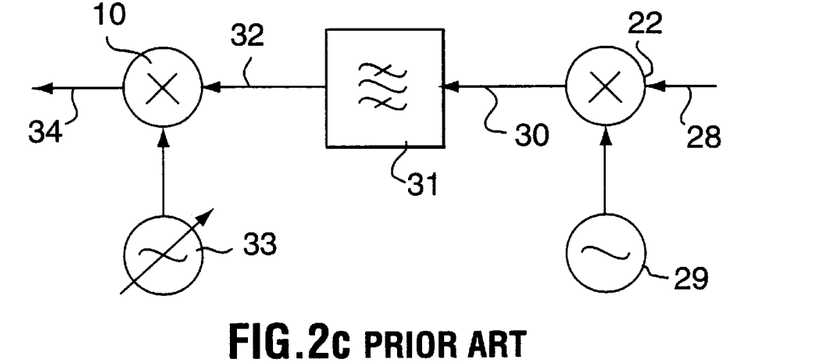
FIG. 2c is a schematic illustration of a conventional mixing stage for a heterodyne receive unit.

A heterodyne receiver employing two mixers as in FIG. 2b is also well known to those skilled in the art. The elements of such an all-band receiver are illustrated in FIG. 2c. The received signal enters at 28 is mixed in mixer 22 with the output of a local oscillator 29 yielding a signal 30 which is filtered 31 to allow one side-band only at 32. The signal at 32 is mixed 10 with a second local oscillator source 33 to yield the Receive IF signal at 34. It will be understood by persons skilled in the art that the circuit of FIG. 2c is a double downconverter rather than a double upconverter as shown in FIG. 2b. The output of mixer 22 has a component equal to the difference of the RF frequency 28 and the frequency of the local oscillator 29 and a component equal to the sum of these frequencies. The filter 31 selects the difference component and rejects the sum component. The selected first downconverted signal is then mixed in mixer 10 with signals from local oscillator 33 to obtain a second downconverted signal having a frequency equal to the difference of the frequency of the first downconverted signal and the signal from local oscillator 33. As is known to persons skilled in the art, there would be a component in output 34 which is equal to the sum of the two signals input to mixer 10 but, again as known to persons skilled in the art, this sum component would be filtered out at some later stage in the circuitry. In the context of the above example, the mobile receive signal is in the range 1930.05–1989.99, requiring local oscillator 29 to be at 882.50 MHz, band-pass filter 31 to span 1047.55–1107.49 MHz and variable local oscillator 33 covering the range 882.50–942.44 MHz in 30 KHz steps giving an IF of 165.05 MHz. As in the transmitter system the bandpass filter 31 does not span the same frequency range as the receive window of the PCS system. Its location in the frequency domain is determined by summing the frequencies of the desired Receive IF signal and that of the fixed local oscillator 29.

An all band transceiver could be constructed by combining, into one unit, the systems illustrated in FIGS. 2b and 2c. However the resulting transceiver demands stringent band-rejection characteristics from band-pass filters 18 and 31. Preferably a rejection of up to 100 dB is to be achieved beyond 20.10 MHz of the band edges of either of these filters to ensure adequate isolation between the transmit and receive arms of the transceiver.

Figure 3A:
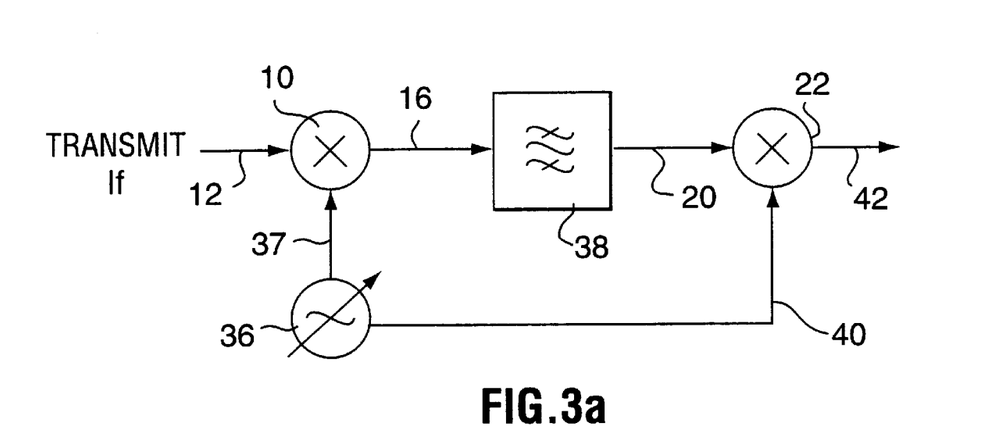
FIG. 3a is a schematic illustration of a mixing stage for a heterodyne transmit unit according to the invention.

FIG. 3a illustrates a schematic representation of a mixing stage, according to the invention, which offers the ability to transmit on all PCS bands. We shall use the same Transmit IF of 85.01 MHz to enable a comparison to be made. Like the system of FIG. 2b, it makes use of two mixers 10 and 22. However, in this system both mixers are supplied by the same local oscillator 36 via connections 37 and 40. Local oscillator 36 operates over the range 882.50–912.47 MHz and uses one half channel bandwidth steps, namely 15 KHz steps in the case of the example. Additionally, band-pass filter 18 is replaced with a band-pass filter 38 having a 50% reduced bandwidth of 29.97 MHz over the range 967.51–997.48 MHz. As with the FIG. 2b circuit, the difference component output from mixer 10 is rejected by filter 38 and the first upconverted signal 20 corresponding to the sum component is mixed at the second mixer 22 directly with the signal from local oscillator 36 applied via connection 40. As with the FIG. 2 circuit, the upconverted heterodyne transmit signal output at 42 is a second upconverted signal having a frequency signal output at 42 is a second upconverted signal having a frequency equal to the sum of the first upconverted signal and the local oscillator frequency and is in the range 1850.01–1909.95 MHz. As would be understood by someone skilled in theart, there is also output at 42 a difference component but this is of no significance and would be filtered out at a later stage in the circuitry.

In the embodiment illustrated, a single local oscillator 36 is employed at both mixing stages. In comparison to the conventional counterpart system illustrated in FIG. 2b this modification reduces the sweep range and the frequency step size by 50%. Most importantly, however, the filter bandwidth is also reduced by 50% in comparison to the transmitter architectures detailed in FIGS. 2a and 2b. For a given Transmit IF frequency this system also requires a lower absolute local oscillator frequency, advantageous both in terms of both unit cost and system simplicity.

Figure 3B:
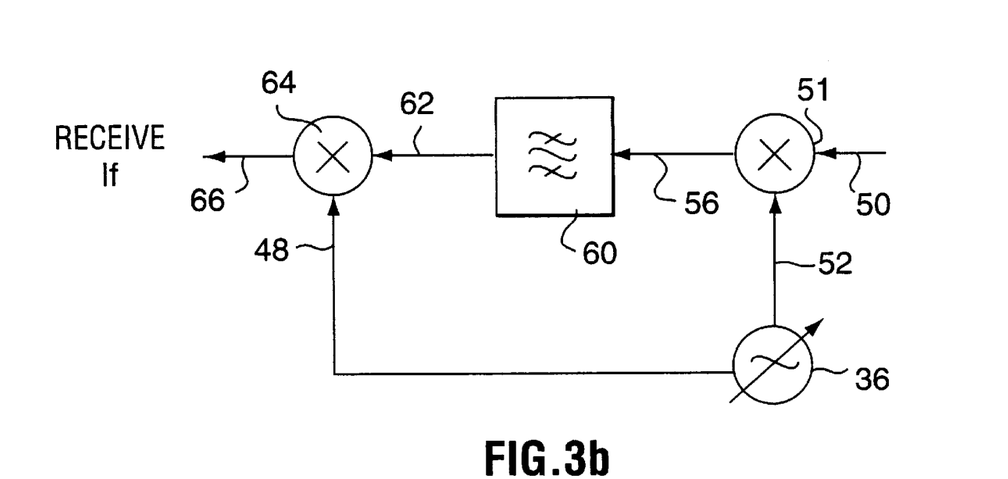
FIG. 3b is a schematic illustration of a mixing stage for a heterodyne receive unit according to the invention.

FIG. 3b shows, according to the invention, a schematic representation of a mixing stage for a receiver unit enabling all-band PCS reception. As in the transmitter unit of FIG. 3a it utilizes double mixing using a single variable frequency local oscillator source. The received signal (in the mobile receive range 1930.05 MHz to 1989.99 MHz as per the example) is input to the unit at 50 and mixed at 51 with the signal supplied along line 52 from variable frequency (tunable) local oscillator 36 operating over the same range (882.50–912.47 MHz) as shown in the transmission system of FIG. 3a. The mixed output 56 inputs to a band-pass filter 60 with a 29.97 MHz pass-band covering the range 1047.55–1077.52 MHz. The filtered signal 62 enters a second mixer unit 64 and is combined with output from local oscillator source 54 via connector 48. The resulting mixed signal is the down-converted Receive IF output appearing at 66. According to the example, pass-band filter 60 exhibits the same rejection characteristics of filter 38 but over a range 80.04 MHz higher in frequency. The resulting Receive IF signal is at 165.05 MHz. It should be understood from the above description of FIG. 3b that there are two downconversion stages. The output of the first mixer 51 contains a downconverted component corresponding to the difference of the two input frequencies and a sum component which is rejected by filter 60. This first downconverted signal is then mixed in mixer 64 with signals from local oscillator 36 to provide a second downconverted signal having a frequency equal to the difference of the frequncy of the first downconverted signal and the local oscillator frequency. As would be apparent to persons skilled in the art, there would also be a sum component appearing at output 66 but this would be filtered out at some later stage in the circuitry.

Before proceeding to describe the architecture of combined transmitter and receiver we shall summarize the modifications introduced by the use of a single variable frequency local oscillator in the double mixing process. By their very nature heterodyne transmission and reception systems do not require band-pass filters to be assigned to the same frequency band that is to be passed or rejected.

Band-pass filters in such systems are assigned over frequency ranges which upon mixing with a local oscillator give filtering over a higher or lower portion of the frequency spectrum. This invention implements RF double mixing using a single variable local oscillator source at both mixing stages. Advantages of this approach over conventional transmitters and receivers are apparent in the frequency domain and include; a reduced filter bandwidth, filter centre frequency and sweep range.

Figure 4:
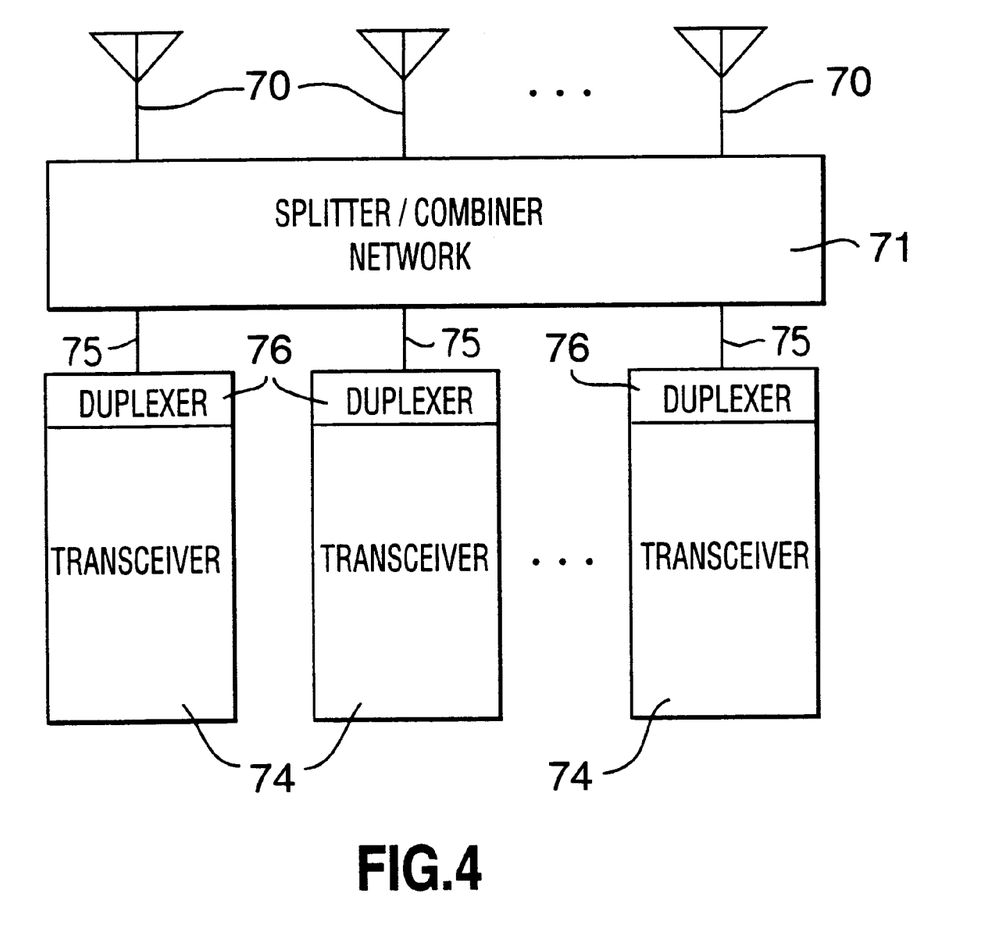
FIG. 4 is a schematic representation of a microcell basestation incorporating transceivers constructed according to the invention.

FIG. 4 illustrates a microcell basestation. Several antennas 70 distributed throughout a building are connected through a splitter/combiner network 72 to several transceivers 74. The lines 75 interconnecting the splitter/combiner network 71 with the transceivers 74 interface with respective duplexers 76 forming part of the transceivers. As will be described with reference to FIG. 5 each duplexer 76 is designed to pass received signals in the range 1850.01–1909.45 MHz and to pass transmit signals in the range 1930.05–1989.99 MHz.

The configuration depicted in FIG. 4 is conventional except that the duplexers are usually designed for a single band (A, B, C, D, E or F) rather than to span all of the bands A–F as in the invention. Also the internal circuitry of the transceivers is not conventional but is designed for implementing the principles of the invention shown in FIGS. 3a and 3b and implemented according to FIG. 5 discussed below.

Signals received in antennas 70 are fed through the splitter/combiner network 71 in an RF stage where they are split among the transceivers 74 in which the received signals are demodulated. The transceivers 74 are also capable of generating transmit signals which are combined in transmit splitter/combiner network 71 and sent to the antennas 70.

Figure 5:
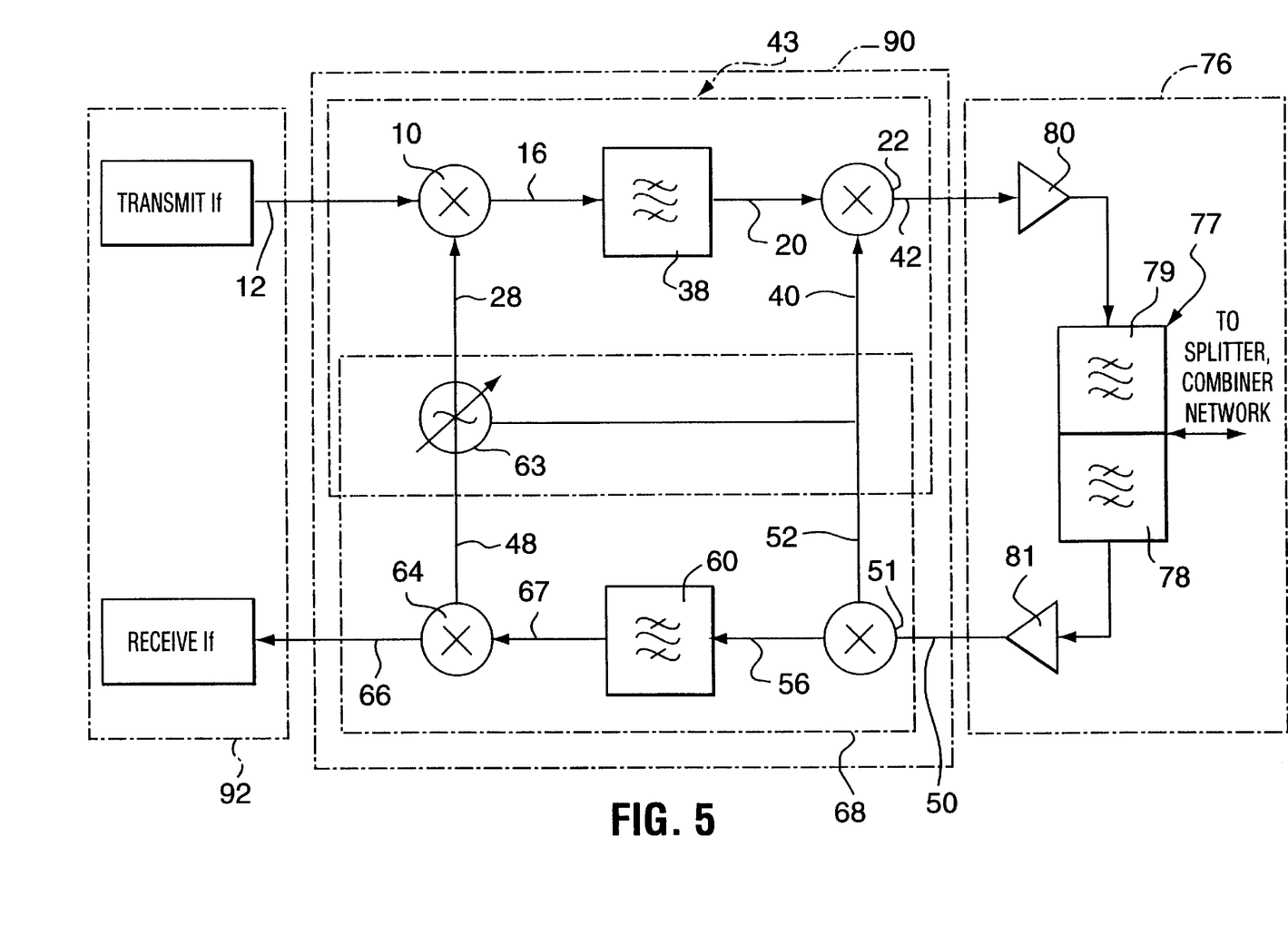
FIG. 5 is a schematic illustration of one of the transceivers of FIG. 4.

Reference should now be made to FIG. 5 which illustrates one of the transceiver units 74 shown in FIG. 4 and constructed according to the invention. Block 90 representing the combination of transmit and receive arms 43 and 68, respectively, as shown in FIGS. 3a and 3b. Block 92 is the interface to further transceiver processing electronics at the desired intermediate frequencies. A single variable local oscillator 63 replaces the two separate local oscillators both identified as 36 in FIGS. 3a and 3b. However, the two separate local oscillators could be used instead, providing they are locked at the same frequency and maintain phase lock.

Duplexer 76 comprises a duplexing filter 77 having a passband filter 78 passing the band 1850.01–1919.45 MHz to the receive side at 50 and a passband filter 79 passing band 1930.05–1989.99 MHz from the transmit side at 42. Amplifiers 80 and 81 are employed to provide necessary amplification to the transmit and receive signals.

In transmission mode the upconverted signal 42 from transmit arm 43 passes through the amplifier 80 and duplex filter 77 to the splitter/combiner network 71 where it is combined with output signals from other transceivers (see FIG. 4) and thence to the antennas 70.

In the receive mode the incoming signals from splitter/combiner network 71 (FIG. 4) are filtered at 77 then amplified in amplifier 81 to supply the input 50 to receive arm 68. The 165.06 MHz Receive IF output appears at 66.

Figure 6:
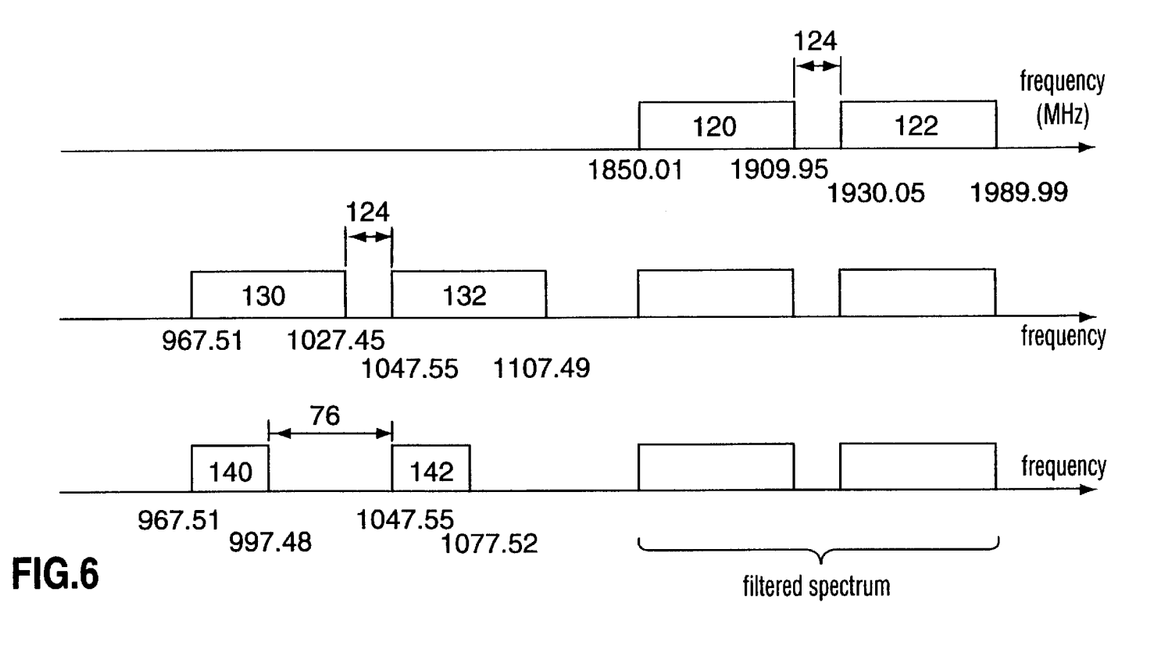
FIG. 6 is a schematic illustration of the spectral relationship between the transmit and receive bands for a system operating in all PCS bands according to the conventional approach and according to the invention respectively.

FIG. 6 illustrates a spectral comparison between the transmit and receive pass-bands of filters required by the transceiver illustrated in FIG. 5 and an all-band transceiver constructed by amalgamating the prior art systems illustrated in FIGS. 2b and 2c. According to the example the conventional microcell PCS reception pass-band 120 extends from 1850.01–1909.95 MHz and the transmission band 122 extends over 1930.05–1989.99 MHz. Thus, there is only 20.10 MHz separation shown as 124 between the upper edge of the receive and the lower edge of the transmit band. In a conventional heterodyne transceiver according to FIGS. 2b and 2c the transmit and receive filters track these bands at a difference of one IF frequency plus the fixed local oscillator frequency. Since the frequencies of the fixed local oscillators 24 and 29 must equal the lowest individual frequency of the variable frequency sources 14 and 33 the spectral range for the receive and transmit filters are 967.51–1027.45 MHz and 1047.55–1077.52 MHz, respectively shown as 130 and 132 in FIG. 6. One can see that the filter characteristics simply map the PCS filter bands but are themselves translocated in the frequency domain.

In the all-band transceiver according to the invention of FIGS. 4 and 5 the transmit and receive filters 38 and 66 have bandwidths exactly 50% of those of their counterpart filters 18 and 31 in FIGS. 2b and 2c. As discussed above this bandwidth reduction is achieved by employing double mixing using a single variable frequency local oscillator source. According to the invention this reduction yields a corresponding increase in the frequency spacing between the upper edge of the mobile transmit filter 38 pass-band and the lower edge of the mobile receive filter 66 pass-band. This can be seen in the transmit and receive filter pass-bands assigned 140 and 142 covering the range 967.51–997.48 MHz and 1047.55–1077.52 MHz, respectively. So according to the example this spacing increases from 20.10 MHz in the case of a conventional transceiver to 50.07 MHz indicated by 76 in the case of the invention.

This combined all-band transceiver has an inherent advantage in the simplicity of its design and improved noise performance. The increased frequency spacing between the transmit and receive filters affords improved isolation between the transmit and receive arms of the transceiver. Also a further source of noise, phase noise in the receive arm 68 introduced by local oscillator 36 in the receive arm is lowered by the associated reduction of the sweep bandwidth from 59.94 MHz to 29.97 MHz.

Figure 7:
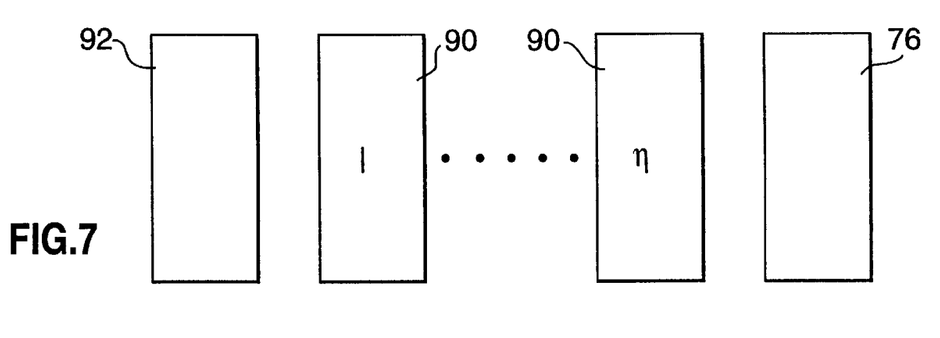
FIG. 7 is a schematic illustration of a generalized mobile transceiver according to the invention.

A generalization of the method employed in the invention can be viewed in FIG. 7 by considering a transceiver comprising unit 92 coupled to a concatenation of n units of 90. All mixers in the system are preferably sourced by the same variable frequency local oscillator. The corresponding increase in bandwidth between the top of the mobile transmit frequency and the bottom of the mobile receive frequency is an increase of $BW(1-1/n)$, where BW is the band-width of all the PCS transmit or receive bands, namely 59.94 MHz in the example. Accordingly, the bandwidth of the nth transmit and receive filters in the nth concatenate would be $BW(1-1/n)$.

The concatenate cannot extend beyond the integer value of n which reduces the nth transmit and receive filter bandwidth to the bandwidth of the widest PCS band. Furthermore, a transceiver system constructed with n significantly greater than 2 would offer diminishing returns because of the sublinear increase in the bandwidth between the upper edge of the receive filter pass-band and the lower edge of the transmit filter pass-band. Also unit costs would rise accordingly.

Although the invention has been described in the context of a microcell basestation it should be apparent that the invention is useful for any receiver, transmitter, or transceiver where performance limits the bandwidth. With particular regard to the PCS communication bands, the invention has applicability, in addition to a microcell basestation, to a cell site monitor and may also be applicable to a PCS mobile if duplex operation of the mobile is available.

What is claimed is:

1. A heterodyne radio transceiver comprising an IF stage, and upconversion transmit mixing stage, a downconversion receive mixing stage and an RF stage, the upconversion transmit mixing stage having an input connected to an output of the IF stage and having an output connected to an input of the RF stage and arranged to upconvert a transmit IF signal at the output of the IF stage to a transmit RF signal supplied to the input of the RF stage, the downconversion receive mixing stage having an input connected to an output of the RF stage and having an output connected to an input of the IF stage and arranged to downconvert a received RF signal at the output of the RF stage to a receive IF signal at the input of the IF stage, wherein the upconversion transmit mixing stage further comprises:

first and second mixers;

a variable frequency local oscillator capable of selectively deriving a plurality of oscillator frequencies and having an output at which a selected frequency is obtained; and a bandpass filter having first and second sides;

the first mixer having a first input connected to the input of the transmit mixing stage, a second input connected to the output of the variable frequency local oscillator and an output connected to the first side of the bandpass filter, the first mixer deriving at the output thereof a first upconverted signal having a frequency equal to the sum of the frequency of the transmit IF signal and the selected local oscillator frequency and the bandpass filter having a passband arranged to pass the first upconverted signal;

the second mixer having a first input connected to the second side of the bandpass filter, a second input connected to the output of the variable frequency local oscillator and the output serving as an output of the transmit mixing stage, the output of the transmit mixing stage deriving thereon a second upconverted signal having a frequency equal to the sum of the frequency of the first upconverted signal and the selected local oscillator frequency, the second upconverted signal being the transmit RF signal supplied to the input of the RF stage, whereby the upconversion mixing stage operates as a double upconversion mixer transmitting the bandwidth of the bandpass filter to be reduced;

wherein the downconversion receive mixing stage further comprises:

first and second mixers;

a variable frequency local oscillator capable of selectively deriving a plurality of oscillator frequencies and having an output at which a selected frequency is obtained; and a bandpass filter having first and second sides;

the first mixer having a first input connected to the input of the receive mixing stage, a second input connected to the output of the variable frequency local oscillator and an output connected to the first side of the bandpass filter, the first mixer deriving at the output thereof a first downconverted signal having a frequency equal to the difference of the frequency of the received signal and the selected local oscillator frequency and the bandpass filter having a passband arranged to pass the first downconverted signal;

the second mixer having a first input connected to the second side of the bandpass filter, a second input connected to the output of the variable frequency local oscillator and the output at which is derived the receive IF signal and which serves as an output of the receive mixing stage, the receive IF signal being a second downconverted signal having a frequency equal to the difference of the frequency of the first downconverted signal and the selected local oscillator frequency, whereby the downconversion mixing stage operates as a double downconversion mixer permitting the bandwidth of the bandpass filter to be reduced.

2. A heterodyne radio transceiver as claimed in claim 1, wherein the variable frequency local oscillator of the transmit mixing stage and variable frequency local oscillator of the receive mixing stage are locked at the same frequency and maintain zero phase difference.

3. A heterodyne radio transceiver as claimed in claim 2, wherein the output of the transmit mixing stage and the input of the receive mixing stage are interconnected by means of a duplexing filter to isolate transmit bands from receive bands.

4. A basestation comprising a plurality of transceivers each as claimed in claim 2, wherein, for each transceiver, the output of the transmit mixing stage and the input of the receive mixing stage are interconnected by means of a duplexing filter to isolate transmit bands from receive bands and wherein all the duplexing filters are connected through a splitter/combiner to a plurality of antennas.

5. A basestation as claimed in claim 4, wherein the variable frequency local oscillator of the transmit mixing stage has a plurality of selectable channels having uniform bandwidth and the variable frequency local oscillator of the receive mixing stage has a plurality of selectable channels having uniform bandwidth.

6. A basestation as claimed in claim 5, wherein the duplexing filter is arranged to pass all the transmit and receive bands specified by a transmission standard.

7. A basestation as claimed in claim 6, wherein the transmission standard is FCC Standard part 24 which for North American PCS (Personal Communication System) specifies a frequency range 1850.01–1909.95 MHz for all band basestation reception and a frequency range 1930.05–1989.99 MHz for all band basestation transmission, each subdivided into 30 KHz channels.

8. A heterodyne radio transceiver as claimed in claim 1, wherein the variable frequency local oscillator of the transmit mixing stage and the variable frequency local oscillator of the receive mixing stage are constituted by a single variable frequency local oscillator.

9. A basestation comprising a plurality of transceivers each as claimed in claim 8, wherein, for each transceiver, the output of the transmit mixing stage and the input of the receive mixing stage are interconnected by means of a duplexing filter to isolate transmit bands from receive bands and wherein all the duplexing filters are connected through a splitter/combiner to a plurality of antennas.

10. A basestation as claimed in claim 9, wherein the single variable frequency local oscillator has a plurality of selectable channels having uniform bandwidth.

11. A basestation as claimed in claim 10, wherein the duplexing filter is arranged to pass all the transmit and receive bands specified by a transmission standard.

12. A basestation as claimed in claim 11, wherein the transmission standard is FCC Standard part 24 which for North American PCS (Personal Communication System) specifies a frequency range 1850.01–1909.95 MHz for all band basestation reception and a frequency range 1930.05–1989.99 MHz for all band basestation transmission, each subdivided into 30 KHz channels.

13. A heterodyne radio transceiver as claimed in claim 8, wherein the output of the transmit mixing stage and the input of the receive mixing stage are interconnected by means of a duplexing filter to isolate transmit bands from receive bands.

14. A basestation comprising a plurality of transceivers each as claimed in claim 1, wherein, for each transceiver, the output of the transmit mixing stage and the input of the receive mixing stage are interconnected by means of a duplexing filter to isolate transmit bands from receive bands and wherein all the duplexing filters are connected through a splitter/combiner to a plurality of antennas.

15. A basestation as claimed in claim 14, wherein the variable frequency local oscillator of the transmit mixing stage has a plurality of selectable channels having uniform bandwidth and the variable frequency local oscillator of the receive mixing stage has a plurality of selectable channels having uniform bandwidth.

16. A basestation as claimed in claim 15, wherein the duplexing filter is arranged to pass all the transmit and receive bands specified by a transmission standard.

17. A basestation as claimed in claim 16, wherein the transmission standard is FCC Standard part 24 which for North American PCS (Personal Communication System) specifies a frequency range 1850.01–1909.95 MHz for all band basestation reception and a frequency range 1930.05–1989.99 MHz for all band basestation transmission, each subdivided into 30 KHz channels.

18. A heterodyne radio transceiver as claimed in claim 1, wherein the variable frequency local oscillator of the transmit mixing stage has a plurality of selectable channels having uniform bandwidth and the variable frequency local oscillator of the receive mixing stage has a plurality of selectable channels having uniform bandwidth.

* * * * *